United States Patent
Cho et al.

(10) Patent No.: US 7,542,530 B2
(45) Date of Patent: Jun. 2, 2009

(54) APPARATUS AND METHOD FOR CONTROLLING A DIGITAL AUTOMATIC GAIN CONTROLLER IN AN ORTHOGONAL FREQUENCY DIVISION MULTIPLE ACCESS COMMUNICATION SYSTEM

(75) Inventors: Sei-Jei Cho, Seoul (KR); Byung-Ki Kim, Suwon-si (KR); In-Seok Hwang, Seoul (KR); Jang-Hoon Yang, Sungnam-si (KR); Hoon Huh, Sungnam-si (KR); Heon-Ki Chae, Sungnam-si (KR); Soon-Young Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 650 days.

(21) Appl. No.: 11/201,804

(22) Filed: Aug. 10, 2005

(65) Prior Publication Data
US 2006/0034401 A1     Feb. 16, 2006

(30) Foreign Application Priority Data
Aug. 10, 2004    (KR)  .................. 10-2004-0062680

(51) Int. Cl.
    *H04L 27/08*      (2006.01)
(52) U.S. Cl. .................. 375/345; 375/260; 375/316; 375/346; 455/135; 455/138; 455/226.2; 455/226.3; 455/232.1; 330/254
(58) Field of Classification Search ................ 375/316, 375/345, 260
See application file for complete search history.

(56) References Cited

U.S. PATENT DOCUMENTS

| | | | |
|---|---|---|---|
| 6,052,566 A * | 4/2000 | Abramsky et al. | ....... 455/67.11 |
| 6,289,014 B1 * | 9/2001 | Hoshino et al. | ............. 370/392 |
| 6,456,653 B1 | 9/2002 | Sayeed | |
| 7,065,165 B2 * | 6/2006 | Heinonen et al. | ........... 375/345 |
| 2003/0194029 A1 | 10/2003 | Heinonen et al. | |
| 2003/0223354 A1 | 12/2003 | Olszewski | |
| 2004/0004933 A1 | 1/2004 | Zhu et al. | |

(Continued)

FOREIGN PATENT DOCUMENTS

EP       0 814 568      12/1997

(Continued)

OTHER PUBLICATIONS

Kinomura, Masahiro, Automatic Gain Control Circuit, Nov. 14, 1998, EP 0875989 (European Patent Applciation).*

*Primary Examiner*—Chieh M Fan
*Assistant Examiner*—Siu M Lee
(74) *Attorney, Agent, or Firm*—The Farrell Law Firm, PC

(57) ABSTRACT

An apparatus and method for controlling a digital AGC in a communication system in which power changes significantly from frame to frame. In the digital AGC controlling apparatus, an SNR estimator estimates an uplink SNR of a next frame. A power measurer measures uplink received power of every frame. A gain calculator estimates uplink power of an $n^{th}$ frame using an SNR estimate of an $(n-1)^{th}$ frame received from the SNR estimator and a received power measurement of the $(n-1)^{th}$ frame received from the power measurer, and calculates a gain to be applied to the $n^{th}$ frame in the digital AGC using the uplink power estimate of the $n^{th}$ frame.

27 Claims, 3 Drawing Sheets

U.S. PATENT DOCUMENTS

| | | |
|---|---|---|
| 2004/0114506 A1 | 6/2004 | Chang et al. |
| 2004/0192242 A1* | 9/2004 | Dinur et al. ................ 455/272 |
| 2005/0059431 A1* | 3/2005 | Matsui et al. ............ 455/562.1 |
| 2006/0170828 A1* | 8/2006 | Muschallik et al. ......... 348/731 |

FOREIGN PATENT DOCUMENTS

| | | |
|---|---|---|
| EP | 0 875 989 | 11/1998 |
| EP | 0 999 649 | 5/2000 |

* cited by examiner

APPARATUS AND METHOD FOR CONTROLLING A DIGITAL AUTOMATIC GAIN CONTROLLER IN AN ORTHOGONAL FREQUENCY DIVISION MULTIPLE ACCESS COMMUNICATION SYSTEM

PRIORITY

This application claims priority under 35 U.S.C. § 119 to an application entitled "Apparatus And Method For Controlling Digital Automatic Gain Controller In An Orthogonal Frequency Division Multiple Access Communication System" filed in the Korean Intellectual Property Office on Aug. 10, 2004 and assigned Serial No. 2004-62680, the content of which is incorporated herein by reference.

BACKGROUND OF THE INVENTION

1. Field of the Invention

The present invention relates generally to an apparatus and method for controlling a digital automatic gain controller (AGC), and in particular, to an apparatus and method for controlling a digital AGC by estimating the power of an uplink signal in the next frame in an orthogonal frequency division multiple access (OFDMA) communication system, wherein power changes significantly from frame to frame.

2. Description of the Related Art

In general, an analog signal is converted to a digital signal through sampling and quantization in an analog-to-digital converter (ADC). The digital signal is obtained by quantizing the analog signal into quantization levels preset for the ADC. More specifically, the digital signal is bit data representing the range of the analog signal preset for the ADC.

If the amplitude of an ADC input signal is in the preset range, some significant bits, which represent the analog signal, are varying, while the remaining bits are unchanged. In this case, transmission of the unchanged bit values adds up to the amount of transmission data. Consequently, the amplitude of the digital signal is controlled by a digital AGC, thereby taking only the effective bits. This is equivalent to keeping the amplitude of the analog signal constant in an analog AGC and taking significant bits.

FIG. 1 is a block diagram of a conventional AGC apparatus. Referring to FIG. 1, the conventional AGC apparatus includes a digital AGC 101, an effective bit detector 102, a power measurer 103, and a gain calculator 104. The power measurer 103 measures the average power of a signal received for a predetermined time period. The gain calculator 104 calculates a gain for the digital AGC 101 based on the average power measurement. The digital AGC 101 applies the gain to the received signal so that its output signal has desired amplitude. During this operation, the digital AGC 101 adjusts the amplitude of the data by shifting the input digital signal to the left or to the right.

The effective bit detector 102 eliminates unnecessary, least significant bits (LSBs) from the data stream received from the digital AGC 101. That is, the effective bit detector 102 takes only the effective bits having data information from the digital signal input to the digital AGC 101. The digital signal output from the effective bit detector 102 is provided to a channel card, for channel demodulation.

As described above, the conventional communication system calculates a gain for the digital AGC based on the average power of a signal received from a predetermined time period. However, because an OFDMA communication system using multiple carriers performs scheduling on a frame-by-frame basis, subcarriers allocated to each user and the number of the allocated subcarriers vary from frame to frame. Therefore, power changes greatly between frames. Because the conventional AGC apparatus illustrated in FIG. 1 is designed to control the gain of the digital AGC based on the power of the previous received signal under the assumption of a low power variation rate, its application to the OFDMA communication system makes it difficult to detect effective bits with accuracy.

SUMMARY OF THE INVENTION

An object of the present invention is to substantially solve at least the above problems and/or disadvantages and to provide at least the advantages below. Accordingly, an object of the present invention is to provide a digital AGC apparatus applicable to an OFDMA communication system.

Another object of the present invention is to provide an apparatus and method for controlling a digital AGC by estimating the power of an uplink signal in the next frame in an OFDMA communication system.

A further object of the present invention is to provide an apparatus and method for controlling a digital AGC by estimating the power level of the next time interval in a communication system experiencing a great power change from time interval to time interval.

Still another object of the present invention is to provide an apparatus and method for estimating the signal-to-noise ratio (SNR) of the next frame using the data MAP information and carrier-to-interference plus noise ratio (CINR) of the next frame in an OFDMA communication system.

Yet another object of the present invention is to provide an apparatus and method for calculating a gain to be applied to the next frame in a digital AGC using the estimated SNR and received power measurement of the current frame, which were previously calculated in an OFDMA communication system.

The above and other objects are achieved by providing an apparatus and method for controlling a digital AGC in a communication system in which power changes significantly from frame to frame.

According to an aspect of the present invention, in a digital AGC controlling apparatus, an SNR estimator estimates an uplink SNR of a next frame, a power measurer measures uplink received power of every frame, and a gain calculator estimates uplink power of an $n^{th}$ frame using an SNR estimate of an $(n-1)^{th}$ frame received from the SNR estimator and a received power measurement of the $(n-1)^{th}$ frame received from the power measurer, and calculates a gain to be applied to the $n^{th}$ frame in the digital AGC using the uplink power estimate of the $n^{th}$ frame.

According to another aspect of the present invention, in a digital AGC controlling apparatus, an SNR estimator estimates an uplink SNR of a next frame using channel assignment information and a target CINR of the next frame, a power measurer measures the uplink received power of every frame, and a gain calculator estimates uplink noise power of an $n^{th}$ frame using an SNR estimate of an $(n-1)^{th}$ frame received from the SNR estimator and a received power measurement of the $(n-1)^{th}$ frame received from the power measurer, and calculates a gain to be applied to the $n^{th}$ frame in the digital AGC using the uplink noise power estimate of the $n^{th}$ frame.

According to a further aspect of the present invention, in a method of estimating the SNR of a next frame in an OFDMA communication system which performs scheduling on a frame basis, channel assignment information of the next frame is acquired and target CINRs of data bursts allocated to the next frame are acquired. An uplink SNR of the next frame is estimated using the channel assignment information and the target CINRs.

According to still another aspect of the present invention, in a digital AGC controlling method, an uplink SNR of a next frame is estimated in a predetermined time period of every frame, and uplink received power of every frame is measured.

Uplink power of an $n^{th}$ frame is estimated using an SNR estimate of an $(n-1)^{th}$ frame and a received power measurement of the $(n-1)^{th}$ frame, and a gain to be applied to the $n^{th}$ frame in the digital AGC is calculated using the uplink power estimate of the $n^{th}$ frame.

According to yet another aspect of the present invention, in a digital AGC controlling method, an uplink SNR of a next frame is estimated in a predetermined time period of every frame using channel assignment information and a target CINR of the next frame. Uplink received power of every frame is measured. Uplink noise power of an $n^{th}$ frame is estimated using an SNR estimate of an $(n-1)^{th}$ frame and a received power measurement of the $(n-1)^{th}$ frame, and a gain to be applied to the $n^{th}$ frame in the digital AGC is calculated using the uplink noise power estimate of the $n^{th}$ frame.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail because they would obscure the present invention in unnecessary detail.

The present invention is intended to provide a digital AGC apparatus for a communication system suffering from large power variation between time intervals. Such communication systems are multicarrier OFDMA and OFDM communication systems. The following description is made in the context of the OFDMA communication system.

Due to scheduling on a frame basis, the OFDMA communication system may experience a large power variation from frame to frame. Under a multicell environment, however, interference, i.e., noise, from different base stations does not change a lot on the average. Therefore, the less-variant noise power can be computed for each frame and it is possible to estimate the received power of an uplink signal using the noise power. Once the noise power and the received power are estimated, a power gain for a received signal can be calculated. That is, the present invention is characterized in that a digital AGC is controlled using the power gain.

However, before describing the present invention, parameters used herein are as follows:

$EL(n)$: the uplink SNR estimate of an $n^{th}$ frame;

$PM(n)$: the uplink received power measurement of the $n^{th}$ frame;

$EN(n)$: the uplink noise power estimate of the $n^{th}$ frame; and $EP(n)$: the uplink received power estimate of the $n^{th}$ frame.

Figure 1:
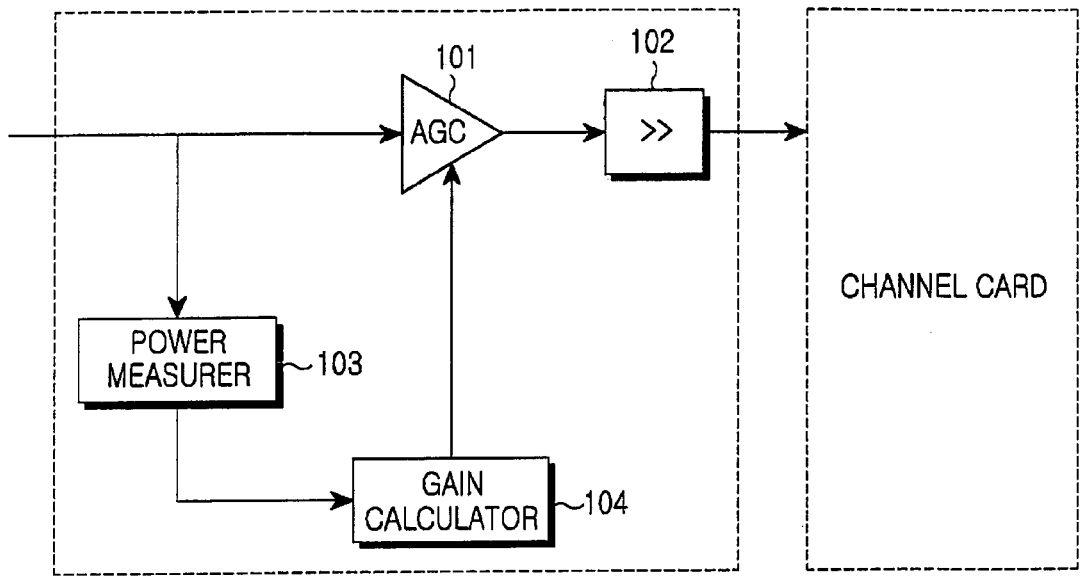
FIG. 1 is a block diagram of a conventional digital AGC apparatus.
Figure 2:
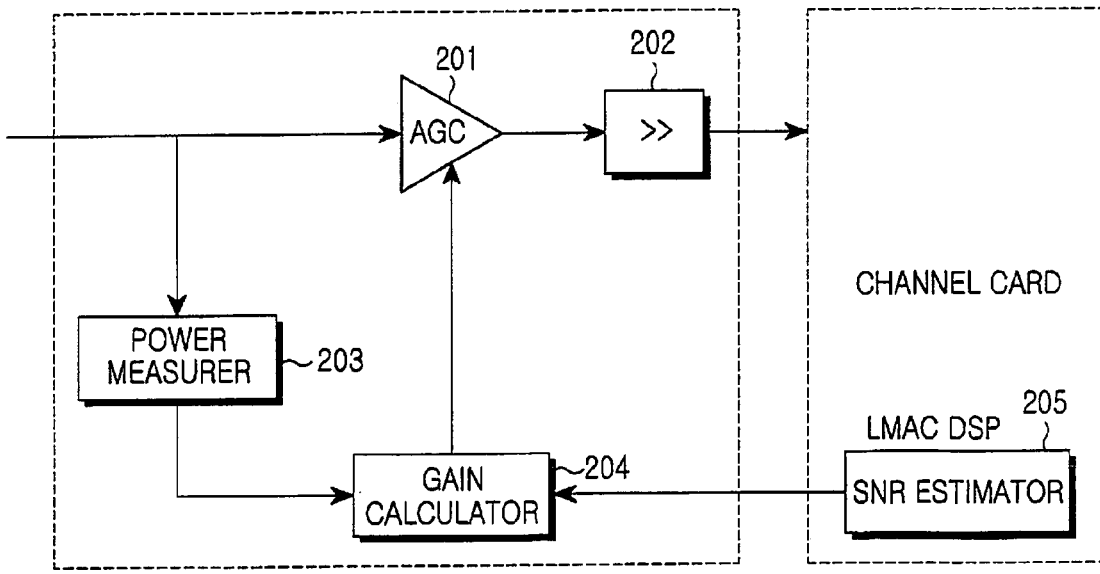
FIG. 2 is a block diagram of a digital AGC apparatus according to an embodiment of the present invention.

FIG. 2 is a block diagram illustrating a digital AGC apparatus according to an embodiment of the present invention. As illustrated in FIG. 2, the digital AGC apparatus includes a digital AGC 201, an effective bit detector 202, a power measurer 203, a gain calculator 204, and a SNR estimator 205. Compared to the conventional digital AGC apparatus illustrated in FIG. 1, the digital AGC apparatus of the present invention further includes the SNR estimator 205. Therefore, the gain calculator 204 calculates a gain in a very different manner from that in the conventional digital AGC apparatus.

Referring to FIG. 2, the power measurer 203 measures the power of a received signal on a frame-by-frame basis. The SNR estimator 205 estimates the SNR of a next frame using the MAP information (or channel assignment information) and CINR of the next frame. Because the SNR estimator 205 is an important component of the present invention, it will be described later in great detail.

The gain calculator 204 calculates a gain for the digital AGC 201 using the received power measurement received from the power measurer 203 and the SNR estimate received from the SNR estimator 205. The gain calculation operation will also be detailed later.

The digital AGC 201 applies the gain to the received signal so that its output has desired amplitude. During this operation, the digital AGC 201 adjusts the amplitude of the data by shifting the input digital signal to the left or to the right.

The effective bit detector 202 eliminates unnecessary LSBs from the data stream received from the digital AGC 201 and outputs the resulting digital to a channel card, for channel demodulation.

In the above embodiment of the present invention, the SNR estimator 205 may be incorporated in a low media access control (LMAC) digital signal processor (DSP) within the channel card, as illustrated in FIG. 2. The SNR estimator 205 uses the data MAP information of the next frame to estimate its SNR and the data MAP information is managed in the LMAC DSP. Accordingly, the SNR estimator 205 is implemented in the LMAC DSP. However, this is an implementation issue.

More specifically, the SNR estimator 205 may be procured separately or configured within the gain calculator 204. In the latter case, the gain calculator 204 estimates the SNR of the next frame using the data MAP information received from the LMAC DSP and calculates the gain of the digital AGC 201 using the SNR estimate and the received power measurement.

In the OFDMA communication system, a mobile station periodically transmits a channel quality indicator (CQI) indicating channel status to a base station. The base station uses CQIs received from mobile stations in downlink and uplink scheduling. Because the base station is responsible for the uplink scheduling, it can estimate the power of signals from the mobile stations. If a mobile station requests data transmission, the base station determines downlink and uplink data rates based on the feedback CQIs. For downlink data transmission, the base station transmits signals with maximum power, and the mobile station transmits signals at a power level corresponding to an assigned data rate.

That is, the base station determines an uplink data rate for the mobile station and the mobile station transmits signals at a power level corresponding to the data rate. If an uplink power control is performed normally in the mobile station, the base station can estimate the power of the uplink signal from the mobile station. Typically, once a data burst is allocated to the mobile station, the data rate is determined and a target CINR is set for the data rate. With a normal power control, the uplink signal from the mobile station is received with the target CINR in the base station. Therefore, the SNR estimator 205 can estimate the SNR (S/N) of the next frame using Equation (1).

$$\text{Estimated Loading} = \frac{S}{N} \qquad (1)$$

$$= \frac{1}{N_{FFT} \cdot N_{UT}} \sum_{m=0}^{N_{burst}-1} CINR(m) \cdot N_{SCH}(m) \cdot k$$

The parameters involved in Equation (1) are the data MAP information of the frame. $N_{burst}$ represents the number of data bursts to be transmitted from mobile stations, that is, the number of uplink data burst allocated in the frame, $N_{FFT}$ represents the total number of subcarriers, $N_{UT}$ represents the number of uplink data symbols per frame, $CINR(m)$ represents the target CINR of an $m^{th}$ data burst, $N_{SCH}(m)$ represents the number of subchannels allocated to the $m^{th}$ data burst, and k represents power allocated per subchannel. The OFDMA system defines one subchannel to include a plurality of subcarriers.

Accordingly to an embodiment of the present invention, if one subchannel has 54 subcarriers, 48 subcarriers are allocated to data and 6 subcarriers are allocated to pilots. The 48 data subcarriers are of the same power and a pilot subcarrier is 2.5 dB larger than a data subcarrier. Consequently, k is computed as shown in Equation (2).

$$k = 48 \times 1 + 6 \times 10^{(2.5/10)} = 58.6 \qquad (2)$$

The SNR estimator 205 estimates the SNR (EL: expected loading) of the next frame at every frame using Equation (1) and provides the SNR estimate to the gain calculator 204. To calculate a gain for an $n^{th}$ frame, the SNR estimator 205 provides the SNR estimate of an $(n-1)^{th}$ frame, $EL(n-1)$ calculated in the time period of an $(n-2)^{th}$ frame to the gain calculator 204.

In operation, the gain calculator 204 receives $EL(n-1)$ from the SNR estimator 205 to calculate a gain for the $n^{th}$ frame. At the end of the $(n-1)^{th}$ frame, the gain calculator 204 receives the received power measurement of the $(n-1)^{th}$ frame, $PM(n-1)$ from the power measurer 203. $EL(n-1)$ and $PM(n-1)$ are expressed as shown in Equation (3)

$$EL(n-1) = S(n-1)/N(n-1)$$

$$PM(n-1) = S(n-1) + N(n-1) \qquad (3)$$

The gain calculator 204 calculates the uplink noise power of the $(n-1)^{th}$ frame in the downlink time period of the $n^{th}$ frame using Equation (4).

$$N(n-1) = \frac{PM(n-1)}{EL(n-1)+1} \qquad (4)$$

As described above, the noise power is constant in the OFDMA communication system. Therefore, the uplink noise power of the $n^{th}$ frame is approximated using Equation (5)

$$EN(n) \cong N(n-1) = \frac{PM(n-1)}{EL(n-1)+1} \qquad (5)$$

The gain calculator 204 then calculates the uplink received power estimate of the $n^{th}$ frame, $EP(n)$ using the uplink noise power of the $n^{th}$ frame estimated by Equation (5), as follows.

$$EP(n) = S(n) + N(n) \qquad (6)$$

$$= N(n) \times \{EL(n) + 1\}$$

$$= EN(n) \times \{EL(n) + 1\}$$

$$= \frac{PM(n-1)}{EL(n-1)+1} \{EL(n) + 1\}$$

The gain calculator 202 calculates the gain of the digital AGC 201, $Gain(n)$ using the uplink noise power estimate or the uplink received power estimated of the $n^{th}$ frame, $EN(n)$ or $EP(n)$.

In the case of using $EN(n)$, Equation (7) can be utilized.

$$Gain(n) = \sqrt{\frac{N_{threshold}}{EN(n)}} \quad \text{(linear scale)} \qquad (7)$$

As noted from Equation (7), a desired noise power value $N_{threshold}$ is preset and the gain value is controlled based on the ratio of $N_{threshold}$ to $EN(n)$. As a result, the noise of a signal that has passed through the digital AGC 201 is maintained at $N_{threshold}$.

In the case of using $EP(n)$, Equation (8) can be utilized.

$$Gain(n) = \sqrt{\frac{P_{threshold}}{EP(n)}} \quad \text{(linear scale)} \qquad (8)$$

As noted from Equation (8), a desired signal power value $P_{threshold}$ is preset and the gain value is controlled based on the ratio of $P_{threshold}$ to $EP(n)$. In this case, the power of a signal that has passed through the digital AGC 201 is maintained at $P_{threshold}$.

Figure 3:
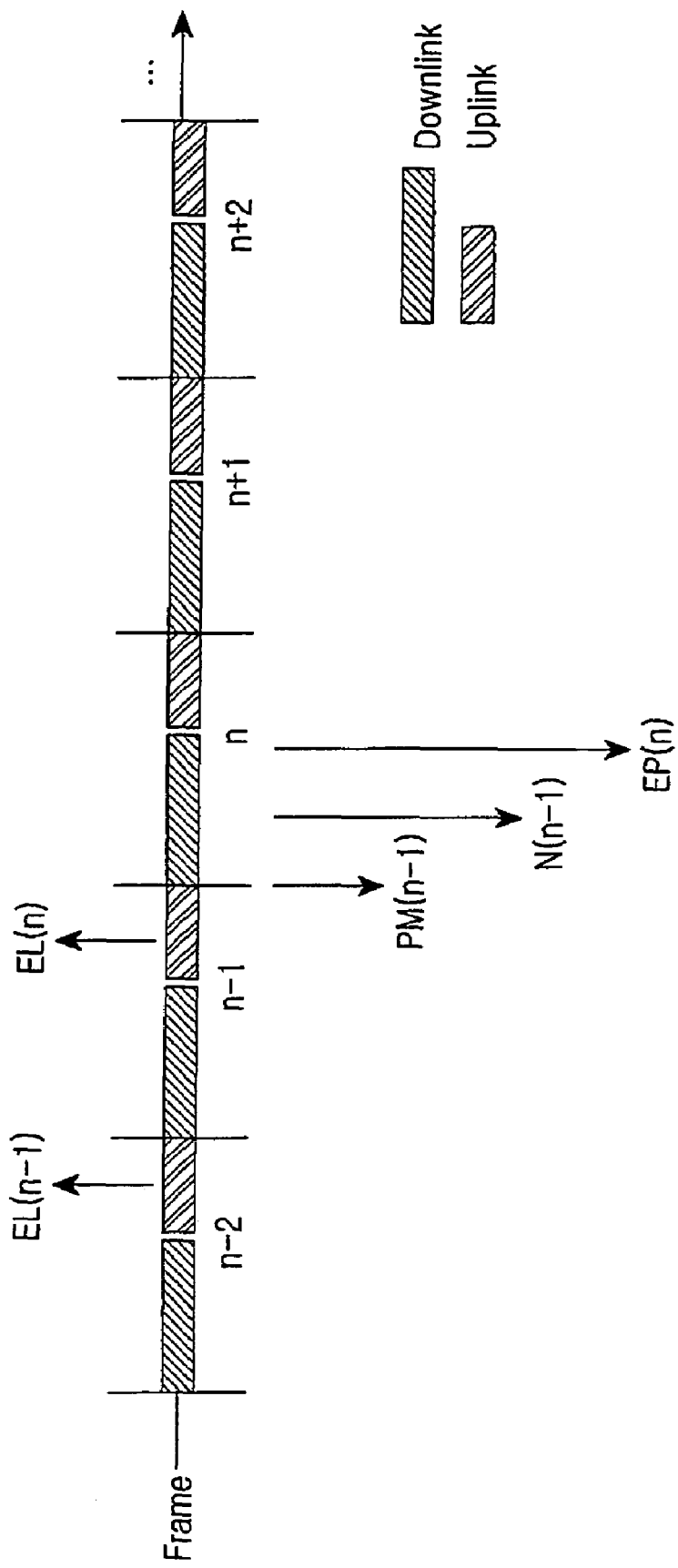
FIG. 3 is a diagram illustrating an AGC gain calculation represented on a time axis according to the present invention.

The above gain calculation is represented on a time axis as illustrated in FIG. 3. Referring to FIG. 3, to obtain an AGC gain for the $n^{th}$ frame, the uplink SNR estimate $EL(n-1)$ of the $(n-1)^{th}$ frame is calculated in the uplink time period of the $(n-2)^{th}$ frame. At the end of the $(n-1)^{th}$ frame, the uplink received power $PM(n-1)$ of the $(n-1)^{th}$ frame is measured. In the uplink time period of the $n^{th}$ frame, the uplink noise power $N(n)$ and received power $PM(n)$ of the $n^{th}$ frame are approximated using $EL(n-1)$ and $PM(n-1)$ in the time period of the $n^{th}$ frame. The AGC gain is then calculated using $N(n)$ or $PM(n)$.

In this context, the overall procedure of controlling the digital AGC will be described below.

Figure 4:
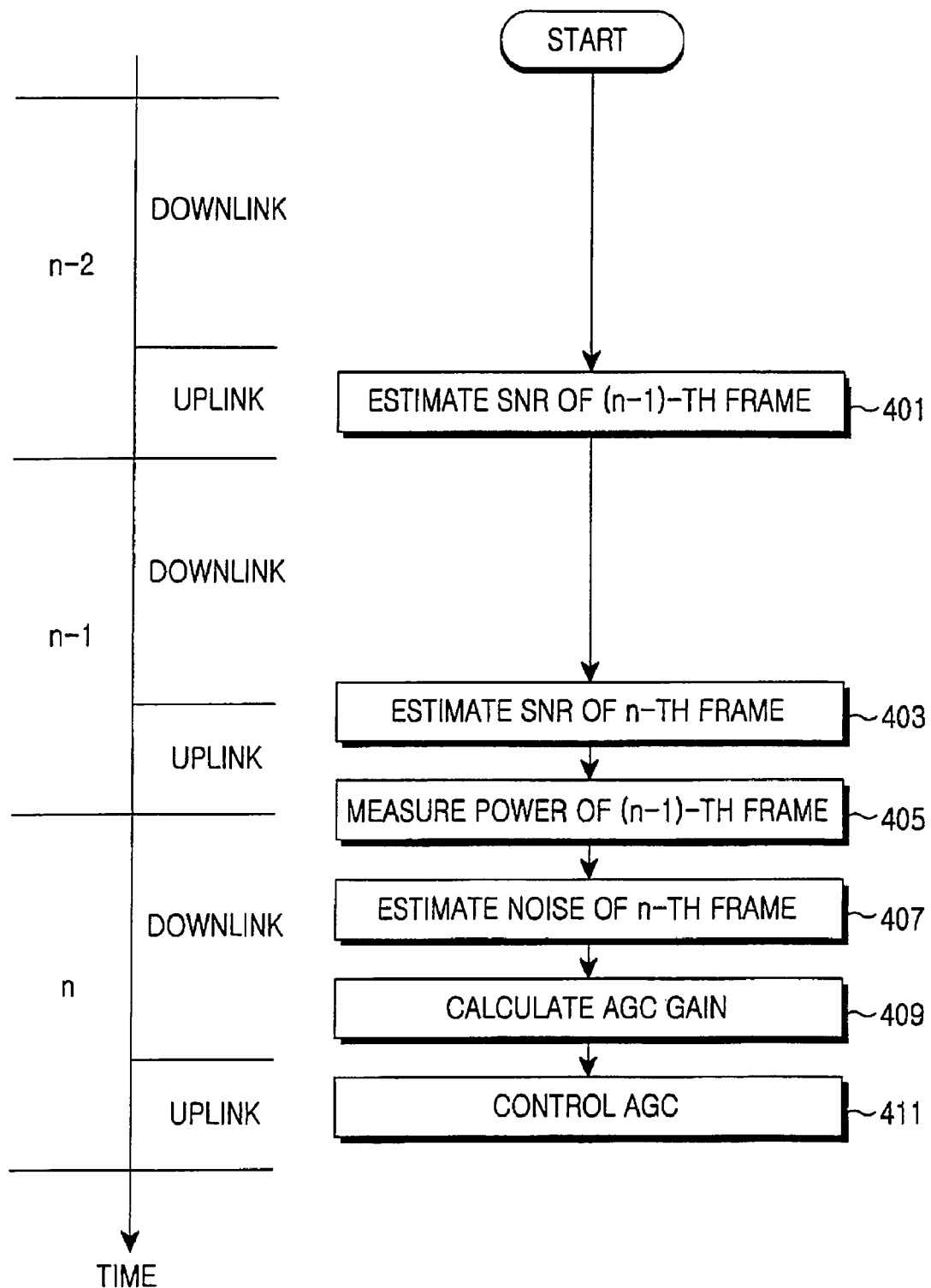
FIG. 4 is a flowchart illustrating a procedure for controlling a gain of a digital AGC in an OFDMA communication system according to an embodiment of the present invention.

FIG. 4 is a flowchart illustrating a procedure for controlling a gain of a digital AGC in an OFDMA communication system according to an embodiment of the present invention. More specifically, this procedure takes place in a base station and thus, the following description is made with the same context.

Referring to FIG. 4, to calculate the gain of the digital AGC for the $n^{th}$ frame, the base station calculates the uplink SNR estimate $EL(n-1)$ of the $(n-1)^{th}$ frame in the uplink time period of the $(n-2)^{th}$ frame using Equation (1) in step 401. As noted from Equation (1), the base station estimates the SNR of a next frame using the data MAP information and CINR of the next frame. The data MAP information may include the number of data bursts $N_{burst}$, the total number of subcarriers $N_{FFT}$, the number of uplink data symbols per frame $N_{UT}$, the number of subchannels allocated to a data burst $N_{SCH}(m)$, and power allocated per subchannel, k.

In step 403, the base station calculates the uplink SNR estimate EL(n) of the $n^{th}$ frame in the uplink time period of the $(n-1)^{th}$ frame. EL(n) is used later to calculate a gain for an $(n+1)^{th}$ frame.

In step 405, at the end of the $(n-1)^{th}$ frame, the base station measures the uplink received power PM(n−1) of the $(n-1)^{th}$ frame. The base station estimates the uplink noise power of the $n^{th}$ frame using EL(n−1) and PM(n−1) in the uplink time period of the $n^{th}$ frame in step 407. The uplink noise power of the $n^{th}$ frame is computed by Equation (5), as described above.

In step 409, the base station calculates the AGC gain using the noise power estimate. According to Equation (7), the gain is calculated based on the ratio of the predetermined noise power threshold $N_{threshold}$ to the noise power estimate. The base station controls the digital AGC based on the gain in the uplink time period of the $n^{th}$ frame in step 411.

While the noise power of the $n^{th}$ frame is estimated and the AGC gain is calculated using the noise power estimate in the above embodiment, it can be further contemplated as described above that the received power of $n^{th}$ frame is estimated and the AGC gain is calculated based on the power estimate.

The above-described received power estimation for the next frame is more meaningful in time division duplex (TDD) than in frequency division duplex (FDD). That is, because the same frequency band is alternately used for the downlink and the uplink in TDD, uplink signal reception is not continuous and thus, a conventional method based on average power is not viable. Therefore, the present invention is effective in TDD. However, uplink reception is continuous in FDD and thus the conventional average power-based method and the present invention are applicable to FDD. Consequently, the present invention is applicable to both TDD and FDD.

As described above, the present invention advantageously enables estimation of the SNR of the uplink signal in the next frame in an OFDMA or OFDM communication system where received power changes significantly from frame to frame. Because the power of the uplink signal in the next frame is estimated using the previously estimated SNR of the current frame and the received power measurement of the current frame, and the digital AGC is controlled by the power estimate, the digital AGC can detect effective bits more accurately.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. An apparatus for controlling a digital automatic gain controller (AGC), comprising:
   a signal-to-noise ratio (SNR) estimator for estimating an uplink SNR of a following frame using channel assignment information and a target carrier-to-interference plus noise ratio (CINR) of the following frame;
   a power measurer for measuring uplink received power of every frame; and
   a gain calculator for estimating uplink power of an $n^{th}$ frame using an SNR estimate of a $(n-1)^{th}$ frame received from the SNR estimator and a received power measurement of the $(n-1)^{th}$ frame received from the power measurer, and calculating a gain to be applied to the $n^{th}$ frame in the digital AGC using the uplink power estimate of the $n^{th}$ frame.

2. The apparatus of claim 1, wherein the digital AGC controls the amplitude of an input signal using the gain received from the gain calculator, and outputs a controlled data stream.

3. The apparatus of claim 2, further comprising an effective bit detector for extracting only effective bits from the data stream and outputting the effective bits.

4. The apparatus of claim 1, wherein the target CINR is determined according to channel quality indicators (CQIs) fed back from mobile stations.

5. The apparatus of claim 1, wherein the channel assignment information is a MAP information including information about data bursts allocated to the frame.

6. The apparatus of claim 1, wherein the SNR estimator estimates the uplink SNR using:

$$\frac{S}{N} = \frac{1}{N_{FFT} \cdot N_{UT}} \sum_{m=0}^{N_{burst}-1} CINR(m) \cdot N_{SCH}(m) \cdot k$$

where $N_{burst}$ represents a number of data bursts allocated to the frame, $N_{FFT}$ represents a total number of subcarriers, $N_{UT}$ represents a number of uplink data symbols per frame, CINR(m) represents a target CINR of an $m^{th}$ data burst, $N_{SCH}(m)$ represents a number of subchannels allocated to the $m^{th}$ data burst, and k represents power allocated per subchannel.

7. The apparatus of claim 1, wherein the gain calculator estimates uplink noise power of the $n^{th}$ frame, and calculates the gain to be applied to the $n^{th}$ frame in the digital AGC using a ratio between the noise power estimate and a predetermined threshold.

8. The apparatus of claim 1, wherein the gain calculator estimates uplink received power of the $n^{th}$ frame, and calculates the gain to be applied to the $n^{th}$ frame in the digital AGC using a ratio between the received power estimate and a predetermined threshold.

9. An apparatus for controlling a digital automatic gain controller (AGC), comprising:
   a signal-to-noise ratio (SNR) estimator for estimating an uplink SNR of a next frame using channel assignment information and a target carrier-to-interference plus noise ratio (CINR) of the next frame;
   a power measurer for measuring uplink received power of every frame; and
   a gain calculator for estimating uplink noise power of an $n^{th}$ frame using an SNR estimate of an $(n-1)^{th}$ frame received from the SNR estimator and a received power measurement of the $(n-1)^{th}$ frame received from the power measurer, and calculating a gain to be applied to the $n^{th}$ frame in the digital AGC using the uplink noise power estimate of the $n^{th}$ frame.

10. The apparatus of claim 9, wherein the digital AGC controls an amplitude of an input signal by the gain received from the gain calculator and outputs a controlled data stream.

11. The apparatus of claim 10, further comprising an effective bit detector for extracting effective bits from the controlled data stream and outputting the effective bits.

12. The apparatus of claim 9, wherein the channel assignment information is a MAP information including information about data bursts allocated to the frame.

13. The apparatus of claim 9, wherein the SNR estimator estimates the uplink SNR using:

$$\frac{S}{N} = \frac{1}{N_{FFT} \cdot N_{UT}} \sum_{m=0}^{N_{burst}-1} CINR(m) \cdot N_{SCH}(m) \cdot k$$

where $N_{burst}$ represents a number of data bursts allocated to the frame, $N_{FFT}$ represents a total number of subcarriers, $N_{UT}$ represents a number of uplink data symbols per frame, CINR (m) represents a target CINR of an $m^{th}$ data burst, $N_{SCH}$(m) represents a number of subchannels allocated to the $m^{th}$ data burst, and k represents power allocated per subchannel.

14. The apparatus of claim 9, wherein the gain calculator calculates the gain to be applied to the $n^{th}$ frame in the digital AGC using a ratio between the uplink noise power estimate and a predetermined threshold.

15. A method of estimating a signal-to-noise ratio (SNR) of a next frame in an orthogonal frequency division multiple access (OFDMA) communication system that performs scheduling on a frame basis, comprising the steps of:

acquiring channel assignment information of the next frame;

acquiring target carrier-to-interference plus noise ratios (CINRs) of data bursts allocated to the next frame; and estimating an uplink SNR of the next frame using the channel assignment information and the target CINRs.

16. The method of claim 15, wherein the uplink SNR is estimated using:

$$\frac{S}{N} = \frac{1}{N_{FFT} \cdot N_{UT}} \sum_{m=0}^{N_{burst}-1} CINR(m) \cdot N_{SCH}(m) \cdot k$$

where $N_{burst}$ represents a number of data bursts allocated to the frame, $N_{FFT}$ represents a total number of subcarriers, $N_{UT}$ represents a number of uplink data symbols per frame, CINR (m) represents a target CINR of an $m^{th}$ data burst, $N_{SCH}$(m) represents a number of subchannels allocated to the $m^{th}$ data burst, and k represents power allocated per subchannel.

17. The method of claim 15, wherein the channel assignment information is a MAP information including information about the data bursts allocated to the frame.

18. A method of controlling a digital automatic gain controller (AGC), comprising the steps of:

estimating an uplink signal-to-noise ratio (SNR) of a next frame using channel assignment information and a target carrier-to-interference plus noise ratio (CINR) of the next frame;

measuring uplink received power of every frame; and estimating uplink power of an $n^{th}$ frame using an SNR estimate of an $(n-1)^{th}$ frame and a received power measurement of the $(n-1)^{th}$ frame; and calculating a gain to be applied to the $n^{th}$ frame in the digital AGC using the uplink power estimate of the $n^{th}$ frame.

19. The method of claim 18, wherein the target CINR is determined according to channel quality indicators (CQIs) fed back from mobile stations.

20. The method of claim 18, wherein the channel assignment information is a MAP information including information about data bursts allocated to the frame.

21. The method of claim 18, wherein the uplink SNR is estimated using:

$$\frac{S}{N} = \frac{1}{N_{FFT} \cdot N_{UT}} \sum_{m=0}^{N_{burst}-1} CINR(m) \cdot N_{SCH}(m) \cdot k$$

where $N_{burst}$ represents a number of data bursts allocated to the frame, $N_{FFT}$ represents a total number of subcarriers, $N_{UT}$ represents a number of uplink data symbols per frame, CINR (m) represents a target CINR of an $m^{th}$ data burst, $N_{SCH}$(m) represents a number of subchannels allocated to the $m^{th}$ data burst, and k represents power allocated per subchannel.

22. The method of claim 21, wherein the uplink power estimate is a noise power estimate.

23. The method of claim 22, wherein the gain calculation is performed using:

$$Gain(n) = \sqrt{\frac{N_{threshold}}{EN(n)}} \text{ (linear scale)}$$

where EN(n) represents the noise power estimate and $N_{threshold}$ represents a predetermined threshold.

24. A method of controlling a digital automatic gain controller (AGC), comprising the steps of:

estimating an uplink signal-to-noise ratio (SNR) of a next frame in a predetermined time period of every frame using channel assignment information and a target carrier-to-interference plus noise ratio (CINR) of the next frame;

measuring uplink received power of every frame;

estimating uplink noise power of an $n^{th}$ frame using an SNR estimate of an $(n-1)^{th}$ frame and a received power measurement of the $(n-1)^{th}$ frame; and calculating a gain to be applied to the $n^{th}$ frame in the digital AGC using the uplink noise power estimate of the $n^{th}$ frame.

25. The method of claim 24, wherein the channel assignment information is a MAP information including information about data bursts allocated to the frame.

26. The method of claim 24, wherein the step of estimating the uplink SNR is performed using:

$$\frac{S}{N} = \frac{1}{N_{FFT} \cdot N_{UT}} \sum_{m=0}^{N_{burst}-1} CINR(m) \cdot N_{SCH}(m) \cdot k$$

where $N_{burst}$ represents a number of data bursts allocated to the frame, $N_{FFT}$ represents a total number of subcarriers, $N_{UT}$ represents a number of uplink data symbols per frame, CINR (m) represents a target CINR of an $m^{th}$ data burst, $N_{SCH}$(m) represents a number of subchannels allocated to the $m^{th}$ data burst, and k represents power allocated per subchannel.

27. The method of claim 24, wherein the step of calculating the gain is performed using:

$$Gain(n) = \sqrt{\frac{N_{threshold}}{EN(n)}} \text{ (linear scale)}$$

where EN(n) represents the uplink noise power estimate and $N_{threshold}$ represents a predetermined threshold.

* * * * *